United States Patent [19]

Sanwo et al.

[11] Patent Number: 4,888,501
[45] Date of Patent: Dec. 19, 1989

[54] ECL TO CMOS CONVERTER

[75] Inventors: Ikuo J. Sanwo, San Marcos; John D. Simeral, San Diego; Richard A. Daniel, Escondido, all of Calif.

[73] Assignee: NCR Corporation, Dayton, Ohio

[21] Appl. No.: 259,838

[22] Filed: Oct. 19, 1988

[51] Int. Cl.⁴ .................. H03K 19/02; H03K 19/092; H03K 5/12

[52] U.S. Cl. .................................. 307/475; 307/446; 307/263; 307/264; 307/296.1

[58] Field of Search ............... 307/443, 446, 448, 451, 307/263, 264, 475, 296 R

[56] References Cited

U.S. PATENT DOCUMENTS

| | | | |
|---|---|---|---|
| 3,946,246 | 3/1976 | Marley | 307/218 |
| 4,437,171 | 3/1984 | Hudson et al. | 365/177 |
| 4,496,856 | 1/1985 | Ransom et al. | 307/475 |
| 4,599,521 | 7/1986 | Kanai et al. | 307/455 |
| 4,645,951 | 2/1987 | Uragami | 307/446 |
| 4,656,375 | 4/1987 | Lauffer et al. | 307/475 |
| 4,680,480 | 7/1987 | Hopta | 307/270 |
| 4,697,109 | 9/1987 | Honma et al. | 307/475 |
| 4,742,247 | 5/1988 | Venkatesh | 307/231 |
| 4,785,205 | 11/1988 | Sanwo et al. | 307/451 |

*Primary Examiner*—John S. Heyman
*Assistant Examiner*—Margaret Rose Wambach
*Attorney, Agent, or Firm*—Wilbert Hawk, Jr.; Stephen F. Jewett; Douglas S. Foote

[57] ABSTRACT

The subject invention is an ECL to CMOS converter for converting high or low ECL logic signals. The converter comprises a CMOS inverter for providing low or high CMOS logic signals at its output in response to a first or second signal, respectively, applied to its input. The first signal must exceed a first predetermined value and the second signal must fall below a second predetermined value. The first and second predetermined values are such that either the low ECL signal does not fall below the second predetermined value or the high ECL signal does not exceed the first predetermined value. The converter also provides means for converting the high and low logic signals to the first and second signals, respectively.

22 Claims, 2 Drawing Sheets

ECL TO CMOS CONVERTER

The present invention relates to a voltage level converter circuit and, more particularly, to a circuit for converting ECL logic levels to CMOS logic levels.

BACKGROUND OF THE INVENTION

Two logic circuits common in microelectronic applications are ECL and CMOS circuits. One difference between the two is that the high and low voltage levels in ECL circuits are different than those in CMOS circuits. For example, typical ECL circuits operate with high and low voltages of approximately −0.9 and −1.7 volts, respectively, whereas typical CMOS circuits operate with high and low voltages of about 0 and −5.2 volts, respectively. In order to couple an output of one such circuit to an input of the other, a converting circuit is commonly employed to change the logic levels supplied by the generating circuit to those required by the input of the receiving circuit.

One problem associated with the conversion of ECL to CMOS levels is that ECL voltages are sensitive to and tend to drift with changes in environmental conditions such as temperature. Because the swing between the high and low levels for ECL logic is only 0.8 volts, changes of a few tenths of a volt can create performance and noise margin problems for the conversion.

Another problem with the use of converter circuits is that they introduce a propagation delay which can also adversely affect performance. In particular, the number of transistors used in a converter has a direct bearing on the propagation delay. Excessive numbers of transistors are also undesirable when the circuit is implemented on an integrated circuit because of the additional chip space required.

OBJECTS OF THE INVENTION

It is therefore an object of the present invention to provide a new and improved ECL to CMOS converter.

It is another object of the present invention to provide an ECL to CMOS converter with improved performance and noise margin.

It is a further object of the present invention to provide an ECL to CMOS converter that automatically compensates for changes in ECL voltage levels.

SUMMARY OF THE INVENTION

The present invention is an ECL to CMOS converter for converting high or low ECL logic signals. The converter comprises a CMOS inverter for providing low or high CMOS logic signals at its output in response to a first or second signal, respectively, applied to its input. The first signal must exceed a first predetermined value and the second signal must fall below a second predetermined value. The first and second predetermined values are such that either the low ECL signal does not fall below the second predetermined value or the high ECL signal does not exceed the first predetermined value. The converter also provides means for converting the high and low logic signals to the first and second signals, respectively.

DETAIL DESCRIPTION OF THE INVENTION

Figure 1A:
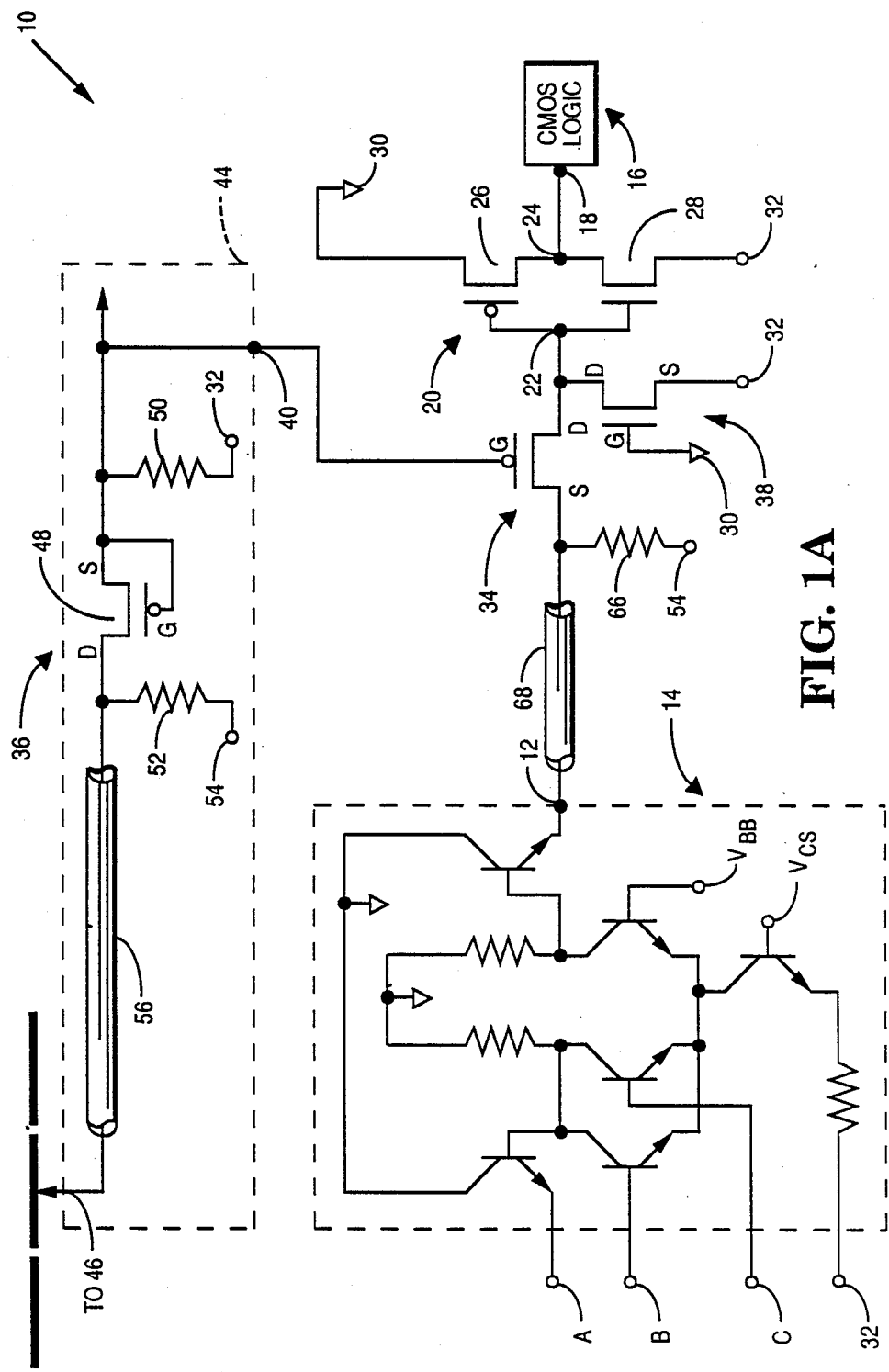
FIGS. 1A and 1B show a circuit diagram including an ECL to CMOS converter according to one form of the present invention.

FIG. 1A shows an ECL to CMOS converter 10 for converting high or low ECL logic signals appearing at an output 12 of an ECL logic circuit 14. ECL circuit 14 is shown as a conventional three input NOR gate (input signals on lines A, B and C). However, the invention is not limited to this configuration and applies equally to any ECL logic circuit. The Figure also shows CMOS logic 16 having an input 18 for receiving CMOS logic level signals from converter 10. The ECL signals appearing at ECL output 12 have a fairly small swing as compared to the CMOS signals required by CMOS logic input 18. For example, typical ECL signals at output 12 are −0.9 and −1.7 volts, whereas the equivalent CMOS signals are 0 and −5.2 volts.

Converter 10 includes a CMOS inverter 20 having an input 22 and output 24. Output 24 is connected to CMOS logic input 18. CMOS inverter 20 comprises P-channel MOS field effect transistor 26 and N-channel MOS field effect transistor 28. Transistors 26 and 28 are connected between power supply terminals 30 and 32 which supply high and low CMOS reference voltages, respectively. In a preferred embodiment power supply terminals 30 and 32 provide 0 and −5.2 volts, respectively. CMOS inverter 20 provides low or high CMOS logic signals at its output 24 in response to a high or low signal applied to its input 22. In order for CMOS inverter 20 to provide the high CMOS reference voltage at its output 24, PMOS 26 must be on and NMOS 28 must be off. Similarly, in order for CMOS inverter 20 to provide the low CMOS reference voltage at output 24, PMOS 26 must be off and NMOS 28 must be on. However, CMOS inverter 20 has a threshold input voltage which must be exceeded in order to turn PMOS 26 off and NMOS 28 on, and has a second lower threshold input voltage which the input voltage must fall below in order to turn PMOS 26 on and NMOS 28 off. For example, the nominal threshold input voltage for CMOS inverter 20 is −2.6 volts with the upper and lower threshold input voltages being above and below, respectively, this value. Although these threshold voltages may vary, typical values are −2.2 volts and −2.9 volts for the upper and lower threshold input voltages, respectively. It will be clear that the high output of ECL logic circuit 14 which is −0.9 volts would be sufficient to turn PMOS 26 off and NMOS 28 on thereby providing −5.2 volts at output 24. However, the low output of ECL logic circuit 14 which is −1.7 volts does not fall below the lower threshold voltage of inverter 20 and therefore would be insufficient to cause output 24 to swing to its high value of 0 volts.

Figure 1B:
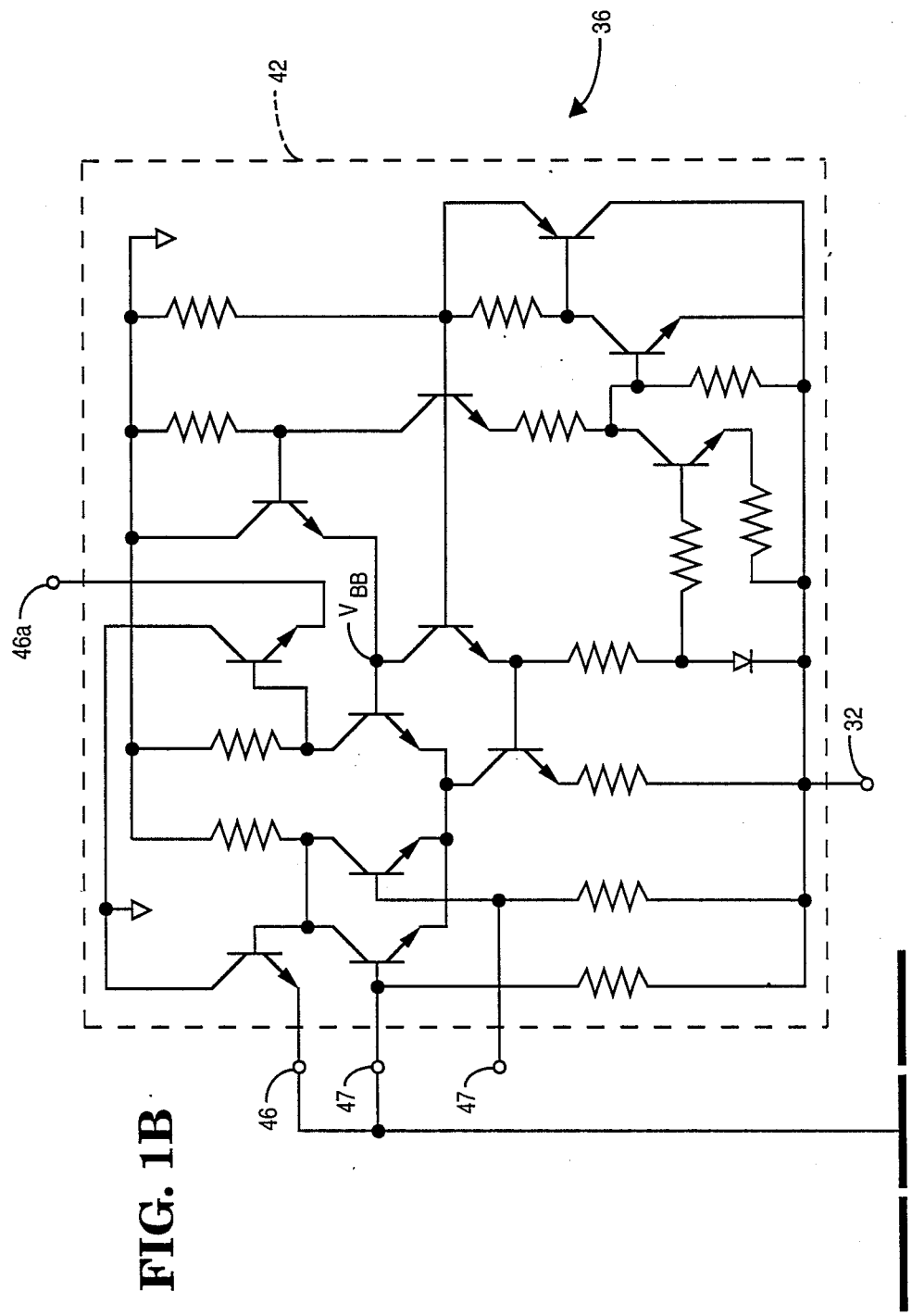

Converter 10 further comprises means for converting the high and low ECL signals appearing at ECL logic circuit output 12 to voltages which exceed and fall below, respectively, the upper and lower threshold voltages of inverter 20. These means include a transfer gate 34, resistive means 38, and a control circuit 36 which comprises a reference voltage generator circuit 42 (FIG. 1B) and a converting circuit 44 (FIG. 1A).

Transfer gate 34 is connected between ECL logic circuit output 12 and CMOS inverter input 22. In a preferred embodiment transfer gate 34 is a PMOS field effect transistor with its source connected to output 12, its drain connected to input 22 and its gate connected to an output 40 of control circuit 36.

Resistive means 38 is connected between CMOS inverter input 22 and power supply terminal 32. In a preferred embodiment, resistive means 38 is an NMOS field effect transistor with its drain connected to input 22, its source connected to power supply terminal 32 and its gate connected to power supply terminal 30.

As noted, control circuit 36 comprises a reference voltage generator circuit 42 and a converting circuit 44. Reference voltage generator circuit 42 (FIG. 1B) provides a reference voltage at an output 46 thereof. Circuit 42 as shown is a two input NOR-OR logic circuit with input lines 47, a NOR output 46 and an OR output 46a. For purposes of generating a reference voltage, output 46 is connected to one of the inputs 47. Circuit 42 is positioned in the same temperature environment as ECL logic circuit 14. In integrated circuit applications circuits 42 and 14 would typically be contained on the same chip. Reference voltage generator circuit 42 is not limited to the particular configuration illustrated in the drawing, but would in most instances be selected from a convenient and unused logic circuit on the chip.

Converting circuit 44 is connected between the output 46 of reference voltage generator circuit 42 and output 40 of control circuit 36. Circuit 44 converts the reference voltage generated by circuit 42 to a control voltage to be applied to the control electrode (gate) of transfer gate 34. According to a preferred embodiment and under normal operating conditions the reference voltage appearing at output 46 will be a nominal −1.3 volts. This value will of course vary with changes in temperature but will track similar variations in the output 12 of ECL logic circuit 14.

Converting circuit 44 includes a PMOS field effect transistor 48 with its drain connected to output 46 of reference voltage generator circuit 42, its source connected to control circuit output 40 and its gate connected to its source. A resistor 50 is connected between the source of PMOS 48 and power supply terminal 32. A resistor 52 is connected between output 46 of reference voltage generator circuit 42 and power supply terminal 54. Power supply terminal 54 typically provides −2.0 volts which is a standard termination voltage for ECL logic. In a preferred embodiment for an integrated circuit application, converting circuit 44 will not be located on the same chip as reference voltage generator circuit 42. Thus, a transmission line 56 will connect output 46 and the drain of PMOS 48. Transmission line 56 will have an effect on the operation of the system due to its impedance.

Converter 10 also includes a resistor 66 connected between the source of PMOS 34 and power supply terminal 54. As with reference voltage generator circuit 42, ECL logic circuit 14 will normally not be located on the same chip as converting circuit 44 and transfer gate 34 for integrated circuit applications. Again, a transmission line 68, having an impedance, will connect output 12 of ECL logic circuit 14 and the source of transfer gate 34.

The values of the various components so far described may vary according to the particular application of the present invention, in a manner known to those skilled in the art. The following table gives the values of selected components of converter 10 according to a preferred embodiment of the present invention.

TABLE

| Component | Value |
| --- | --- |
| Resistor 50 | 1875 ohms |
| Resistor 52 | 50 ohms |

TABLE-continued

| Component | Value |
| --- | --- |
| Resistor 66 | 50 ohms |
| Transmission line 56 | 50 ohms |
| Transmission line 68 | 50 ohms |
| PMOS 26 | 45 u/1.2 u* |
| PMOS 34 | 120 u/1.2 u |
| PMOS 48 | 120 u/1.2 u |
| NMOS 28 | 12 u/1.2 u |
| NMOS 38 | 7.4 u/2.68 u |

*represents channel length/width in micrometers

In operation, consider first the case of ambient conditions and the output of ECL logic circuit being high (−0.9 volts). With reference to control circuit 36, the value at output 46 of reference voltage generator circuit 42 will be about −1.3 volts and the value at drain of PMOS 48 will be about −1.29 volts due to the voltage drop over transmission line 56. PMOS 48 has a threshold voltage of about −2.2 volts and will therefore start to turn on when its gate voltage reaches about −3.5 volts. Since the source and gate are connected the value at control circuit output 40 will settle at about −3.5 volts.

The threshold voltage of PMOS 34 is also about −2.2 volts. Thus, with −3.5 volts at its gate and −0.9 volts at its source, the threshold will be reached (−3.5−−0.9=−2.6) and PMOS 34 will conduct. NMOS 38 will also conduct since its gate is 0 volts and its source is −5.2 volts. From the Table it can be seen that PMOS 34 is much larger than NMOS 38. Thus, as PMOS 34 is driven further into conduction (higher source voltage) its resistance will diminish with respect to that of NMOS 38. Restated, the resistance of PMOS 34 changes with the ECL logic signal applied to its source so that its resistance is relatively low compared to that of NMOS 38 for the high ECL logic signal. This means there will be a larger voltage drop over NMOS 38 and the value at input 22 of CMOS inverter will be relatively closer to the value at output 12 of ECL logic circuit 14. For example, the value at input 22 (for the high ECL voltage at output 12 of −0.9 volts) will be about −1.5 volts. This is high enough to turn PMOS 26 off and NMOS 28 on to provide −5.2 volts at the output 24 of CMOS inverter 20.

Consider next the case where the output 12 of ECL logic circuit 14 is low, −1.7 volts (still assuming ambient conditions). The gate voltage of PMOS 34 will not change from its nominal value of −3.5 volts. The threshold voltage (−2.2 volts) of PMOS 34 will not quite be reached (−3.5−−1.7=−1.8) and PMOS 34 will start to turn off. As it does, its resistance will increase and be relatively high compared to that of NMOS 38. Thus, there will be a lesser voltage drop over NMOS 38 with the value at input 22 of CMOS inverter 20 being about −4.0 volts. Although not quite a CMOS logic level, −4.0 volts is low enough to cause CMOS 26 to switch thereby providing 0 volts at its output 24.

As will now be appreciated, the resistances of PMOS 38 and NMOS 34 vary with changes in the ECL logic circuit output 12. It will also be understood that the balance between PMOS 34 and NMOS 38 would be disturbed (absent control circuit 36) if the ECL output levels were to change. For example, if the low ECL logic level were to increase from −1.7 volts to −1.5 volts and the PMOS 34 gate voltage remained at −3.5 volts, the threshold voltage of −2.2 PMOS 34 would be approached (−3.5−−1.5=−2.0). This would decrease the resistance of PMOS 34 with respect to NMOS 38 thereby increasing the input voltage to CMOS 20. This value might then exceed the lower threshold for CMOS 20 which would prevent CMOS 20 from switching.

The present invention solves this problem by means of control circuit 36 which provides a control voltage at the gate of PMOS 34. This control voltage varies proportionally with changes in ECL levels at output 12 of ECL logic circuit 14 thereby automatically compensating for changes in the ECL levels. For example, if the low ECL logic level were to increase from −1.7 volts to −1.5 volts, then the output 46 of reference voltage generator circuit 42 would see a similar increase, namely, it would increase from −1.3 to −1.1 volts. Converting circuit 44 would in turn provide an increased voltage at the control circuit output 40 from −3.5 to −3.3 volts in a like manner to that described earlier. This then provides the same difference between the gate and source voltages of PMOS 34 as in the ambient case, thereby maintaining the balance between the resistances of PMOS 34 and NMOS 38.

It will be clear to those skilled in the art that the present invention is not limited to the specific embodiment disclosed and illustrated herein. Nor is the invention limited to an application where the low ECL logic level does not fall below the first predetermined value required to switch CMOS inverter 20, as described above. Rather, the invention may be applied equally to an application where the high ECL logic level does not exceed a second predetermined value further required to switch CMOS inverter 20. The necessary changes to element values for this latter application will be clear to those skilled in the art.

Numerous modifications, variations, and full and partial equivalents can be undertaken without departing from the invention as limited only by the spirit and scope of the appended claims.

What is desired to be secured by Letters Patent of the U.S. is as follows.

What is claimed is:

1. An ECL to CMOS converter for converting high or low ECL logic signals appearing at the output of an ECL circuit comprising:
   a CMOS inverter for providing low or high CMOS logic signals at its output in response to a first or second signal, respectively, applied to its input, wherein said first signal must exceed a first predetermined value and said second signal must fall below a second predetermined value, and wherein said low ECL signal does not fall below said second predetermined value; and
   means for converting said high and low ECL logic signals to said first and second signals, respectively, wherein said converting means includes:
   a transfer gate connecting said ECL circuit output to said CMOS inverter input;
   a control circuit for providing at an output thereof a control voltage which varies proportionally with changes in said ECL logic signals, wherein said control circuit output is connected to the control electrode of said transfer gate; and
   resistive means connected between said CMOS inverter input and a first power supply terminal which provides a first CMOS reference voltage.

2. The ECL to CMOS converter of claim 1 wherein said transfer gate is a first PMOS field effect transistor with its source connected to said ECL circuit output, its drain connected to said CMOS inverter input and its gate connected to said control circuit output, and wherein the resistance of said PMOS transistor changes with the ECL logic signal applied to its source so that its resistance is relatively low compared to that of said resistive means for the high ECL logic signal and is relatively high compared to that of said resistive means for the low ECL logic signal.

3. The ECL and CMOS converter of claim 2 wherein said resistive means is an NMOS field effect transistor with its drain connected to said CMOS inverter input, its source connected to said first power supply terminal and its gate connected to a second power supply terminal which provides a second CMOS reference voltage.

4. The ECL to CMOS converter of claim 3 wherein said CMOS inverter is connected between said second and first power supply terminals.

5. The ECL to CMOS converter of claim 1 wherein said control circuit comprises:
   a reference voltage generator circuit for providing a reference voltage at an output thereof, said generator circuit being positioned in the same temperature environment as said ECL circuit.

6. The ECL to CMOS converter of claim 5 wherein said control circuit further comprises:
   a converting circuit for converting said reference voltage to said control voltage, said converting circuit being connected between said output of the reference voltage generator circuit and said control circuit output.

7. The ECL to CMOS converter of claim 6 wherein said converting circuit comprises:
   a second PMOS field effect transistor with its drain connected to said output of the reference voltage generator circuit, its source connected to said control circuit output, and its gate connected to its source.

8. The ECL to CMOS converter of claim 7 wherein said converting circuit further comprises a resistor connected between said source of said second PMOS transistor and said first power supply terminal.

9. The ECL to CMOS converter of claim 5 wherein said reference voltage generator circuit comprises an ECL logic NOR circuit having two inputs with said generator circuit output connected to one of said inputs.

10. An ECL to CMOS converter for converting high or low ECL logic signals appearing at the output of an ECL circuit comprising:
    a CMOS inverter for providing low or high CMOS logic signals at its output in response to a first or second signal, respectively, applied to its input, wherein said first signal must exceed a first predetermined value and said second signal must fall below a second predetermined value, and wherein said high ECL signal does not exceed said first predetermined value; and
    means for converting said high and low ECL logic signals to said first and second signals, respectively, wherein said converting means comprises:
    a transfer gate connecting said ECL circuit output to said CMOS inverter input;
    a control circuit for providing at an output thereof a control voltage which automatically compensates for changes in said ECL logic signals, wherein said control circuit output is connected to the control electrode of said transfer gate; and resistive means connected between said CMOS inverter input and a first power supply terminal which provides a first CMOS reference voltage.

11. The ECL to CMOS converter of claim 10 wherein said transfer gate is a first PMOS field effect transistor with its source connected to said ECL circuit output, its drain connected to said CMOS inverter input and its gate connected to said control circuit output, and wherein the resistance of said PMOS transistor changes with the ECL logic signal applied to its source so that its resistance is relatively low compared to that of said resistive means for the high ECL logic signal and is relatively high compared to that of said resistive means for the low ECL logic signal.

12. The ECL to CMOS converter of claim 11 wherein said resistive means is an NMOS field effect transistor with its drain connected to said CMOS inverter input, its source connected to said first power supply terminal and its gate connected to a second power supply terminal which provides a second CMOS reference voltage.

13. The ECL to CMOS converter of claim 12 wherein said CMOS inverter is connected between said second and first power supply terminals.

14. The ECL to CMOS converter of claim 10 wherein said control circuit comprises:
a reference voltage generator circuit for providing a reference voltage at an output thereof, said generator circuit being positioned in the same temperature environment as said ECL circuit.

15. The ECL to CMOS converter of claim 14 wherein said control circuit further comprises:
a converting circuit for converting said reference voltage to said control voltage, said converting circuit being connected between said output of the reference voltage generator circuit and said control circuit output.

16. The ECL to CMOS converter of claim 15 wherein said converting circuit comprises:
a second PMOS field effect transistor with its drain connected to said output of the reference voltage generator circuit, its source connected to said control circuit output, and its gate connected to its source.

17. The ECL to CMOS converter of claim 16 wherein said converting circuit further comprises a resistor connected between said source of said second PMOS transistor and said first power supply terminal.

18. The ECL to CMOS converter of claim 14 wherein said reference voltage generator circuit comprises an ECL logic NOR circuit having two inputs with said generator circuit output connected to one of said inputs.

19. An ECL to CMOS converter for converting high or low ECL logic signals appearing at the output of an ECL circuit comprising:
a CMOS inverter connected between first and second power supply terminals for providing low or high CMOS logic signals at its output in response to a first or second signal, respectively, applied to its input, wherein said first signal must exceed a first predetermined value and said second signal must fall below a second predetermined value, and wherein said low ECL signal does not fall below said second predetermined value; and
means for converting said high and low ECL logic signals to said first and second signals, respectively, said means including:
a reference voltage generator circuit for providing a reference voltage at an output thereof, said generator circuit being positioned in the same temperature environment as said ECL circuit;
a converting circuit, connected to the output of the reference voltage generator circuit, for converting said reference voltage to a control voltage at an output thereof;
an NMOS field effect transistor with its drain connected to said CMOS inverter input, its source connected to said first power supply terminal and its gate connected to said second power supply terminal; and
a first PMOS filed effect transistor with its source connected to said ECL circuit output, its drain connected to said CMOS inverter input and its gate connected to said converting circuit output, and wherein the resistance of said PMOS transistor changes with the ECL logic signal applied to its source so that its resistance is relatively low compared to that of said NMOS transistor for the high ECL logic signal and is relatively high compared to that of said NMOS transistor for the low ECL logic signal.

20. The ECL to CMOS converter of claim 19 wherein said converting circuit comprises:
a second PMOS field effect transistor with its drain connected to said output of the reference voltage generator circuit, its source connected to said converting circuit output, and its gate connected to its source.

21. The ECL to CMOS converter of claim 20 wherein said converting circuit further comprises a resistor connected between said source of said second PMOS transistor and said first power supply terminal.

22. The ECL to CMOS converter of claim 21 wherein said reference voltage generator circuit comprises an ECL logic NOR circuit having two inputs with said generator circuit output connected to one of said inputs.

* * * * *